(12) United States Patent
Brandt et al.

(10) Patent No.: US 9,184,235 B2
(45) Date of Patent: Nov. 10, 2015

(54) PRODUCTION OF A SEMICONDUCTOR DEVICE HAVING AT LEAST ONE COLUMN-SHAPED OR WALL-SHAPED SEMICONDUCTOR ELEMENT

(71) Applicant: Forschungsverbund Berlin e.V., Berlin (DE)

(72) Inventors: Oliver Brandt, Berlin (DE); Lutz Geelhaar, Berlin (DE); Vladimir Kaganer, Hohen Neuendorf (DE); Martin Woelz, Berlin (DE)

(73) Assignee: Forschungsverbund Berlin e.V., Berlin (DE)

( * ) Notice: Subject to any disclaimer, the term of this patent is extended or adjusted under 35 U.S.C. 154(b) by 0 days.

(21) Appl. No.: 14/357,583

(22) PCT Filed: Nov. 9, 2012

(86) PCT No.: PCT/EP2012/004667
§ 371 (c)(1),
(2) Date: May 12, 2014

(87) PCT Pub. No.: WO2013/068125
PCT Pub. Date: May 16, 2013

(65) Prior Publication Data
US 2014/0312301 A1  Oct. 23, 2014

(30) Foreign Application Priority Data
Nov. 11, 2011 (DE) .......................... 10 2011 118 273

(51) Int. Cl.
*H01L 21/00* (2006.01)
*H01L 29/06* (2006.01)
(Continued)

(52) U.S. Cl.
CPC .............. *H01L 29/122* (2013.01); *H01L 29/04* (2013.01); *H01L 29/16* (2013.01); *H01L 29/20* (2013.01);
(Continued)

(58) Field of Classification Search
CPC ..... H01L 2924/00; H01L 33/32; H01L 33/06; H01L 33/20; H01L 33/08; H01L 33/007; H01L 33/38

USPC .......... 438/22, 24–26, 29, 46, 47; 257/11–14, 257/79, 80–82, 88, 94, 184, 189
See application file for complete search history.

(56) References Cited

U.S. PATENT DOCUMENTS 8,535,962 B2 * 9/2013 Gilet et al. ...................... 438/29
2005/0194598 A1 9/2005 Kim et al.
(Continued)

FOREIGN PATENT DOCUMENTS

EP 2221854 A1 8/2010
WO 02080280 A1 10/2002

OTHER PUBLICATIONS

Guo et al., "Catalyst-Free InGaN/GaN Nanowire Light Emitting Diodes Grown on (001) Silicon by Molecular Beam Epitaxy", Nano Letters, 2010, 10(9), pp. 3355-3359.
(Continued)

*Primary Examiner* — Hsien Ming Lee
(74) *Attorney, Agent, or Firm* — Caesar Rivise, PC

(57) ABSTRACT

Described is a method for producing a semiconductor device (100), in which at least one column-shaped or wall-shaped semiconductor device (10, 20) extending in a main direction (z) is formed on a substrate (30), wherein at least two sections (11, 13, 21, 23) of a first crystal type and one section (12, 22) of a second crystal type therebetween are formed in an active region (40), each section with a respective predetermined height ($h_1$, h2), wherein the first and second crystal types have different lattice constants and each of the sections of the first crystal type has a lattice strain which depends on the lattice constants in the section of the second crystal type. According to the invention, at least a height (h2) of the section (12, 22) of the second crystal type and a lateral thickness (D) of the active region (40) is formed perpendicular to the main direction, in such a manner that the lattice strain in one of the sections (11) of the first crystal type also depends on the lattice constants in the other section (13) of the first crystal type. A semiconductor device (100) is also described, having at least one column-shaped or wall-shaped semiconductor element (10, 20) on a substrate (30), which can be produced in particular by means of the stated method.

21 Claims, 3 Drawing Sheets

(51) Int. Cl.
  *H01L 27/15* (2006.01)
  *H01L 31/109* (2006.01)
  *H01L 29/12* (2006.01)
  *H01L 33/18* (2010.01)
  *H01L 29/04* (2006.01)
  *H01L 29/16* (2006.01)
  *H01L 29/20* (2006.01)
  *H01L 31/0352* (2006.01)
  *H01L 33/06* (2010.01)

(52) U.S. Cl.
  CPC .... *H01L 29/2003* (2013.01); *H01L 31/035209* (2013.01); *H01L 33/06* (2013.01); *H01L 33/18* (2013.01); *H01L 2924/0002* (2013.01)

(56) References Cited

U.S. PATENT DOCUMENTS

2007/0257264 A1 11/2007 Hersee et al.
2008/0218740 A1 9/2008 Williams et al.
2009/0179191 A1 7/2009 Smith et al.
2010/0252836 A1* 10/2010 Kishino et al. .................. 257/76
2011/0127490 A1 6/2011 Mi
2011/0133100 A1* 6/2011 Kambhampati et al. ... 250/459.1
2011/0204327 A1* 8/2011 Hiruma et al. .................. 257/13

OTHER PUBLICATIONS

Kikuchi et al., "InGaN/GaN Multiple Quantum Disk Nanocolumn Light-Emitting Diodes Grown on (111) Si Substrate", Japanese Journal of Applied Physics, vol. 43. No. 12A, pp. L1524-L1526 (2004).
Kishino et al., "InGaN/GaN Nanocolumn LEDs Emitting from Blue to Red", Proc. of SPIE, vol. 6473, pp. 64730T-1-64730T-12 (Feb. 8, 2007).
International Search Report for PCT/EP2012/004667 dated Jan. 23, 2013.

* cited by examiner

PRODUCTION OF A SEMICONDUCTOR DEVICE HAVING AT LEAST ONE COLUMN-SHAPED OR WALL-SHAPED SEMICONDUCTOR ELEMENT

BACKGROUND OF THE INVENTION

The invention refers to a method for the production of a semiconductor device such as a light-emitting component, having at least one column-shaped or wall-shaped semiconductor element, and in particular refers to a method for the production of a semiconductor device where at least one semiconductor element has a lateral thickness in at least one cross-section direction of less than 1 µm, in particular less than 500 nm. The invention furthermore refers to a semiconductor device having at least one column-shaped or wall-shaped semiconductor element, in particular a semiconductor device with at least one nanowire and/or at least one nanowall which is arranged on a substrate. Applications for the invention exist in the production of optical, in particular light emitting, electrical, electromechanical and/or electro-thermal components.

The production of semiconductor elements (nanostructured semiconductor elements) on a substrate which have characteristic dimensions in the submicrometer range is common knowledge. "Top-down" methods such as the selective etching of planar semiconductors, or "bottom-up" methods such as the epitactic growth of nanostructured semiconductors are known for the structuring of a substrate and the production of the semiconductor elements.

For example column-shaped semiconductor elements (nanowires, nanocolumns) (see for example US 2011/0127490 A1 or US 2007/0257264 A1) or wall-shaped semiconductor elements (nanowalls, nanoplates, nanodiscs) are produced on a substrate with the specified methods. Typically, nanowire heterostructures are produced which include segments with various types of crystal along a main direction of the semiconductor elements, e.g. with different chemical composition or different doping, in order to provide the semiconductor element with specific optical, electrical, mechanical and/or thermal properties.

It is furthermore known that these properties of nanostructured semiconductors differ from semiconductors which are planar or have a bulk shape because the structuring influences the conduction properties and band characteristics. It is pointed out in US 2011/0127490 A1 that the nanowires are characterised by a negligible number of dislocations compared to planar semiconductors due to an effective stress relaxation.

The production of light emitting components (light emitting diodes, LEDs) from nanostructured semiconductors has been proposed. For example, K. Kishino et al. ("Proceedings of SPIE", Volume 6473, 2007, P. 6473T-1-64730T-12) and A. Kikuchi et al. (in "Japanese Journal of Applied Physics", Volume 43, 2004, P. L1524-L1526) describe LEDs which consist of (In,Ga)N/GaN nanowires on sapphire or silicon substrates and which emit light in the visible spectral range. The nanowires are formed as heterostructures by self-organisation, whereby sections of a crystal type with a lower band gap (quantum well sections) alternate with sections of a crystal type with a larger band gap (barrier sections) in the main direction of the nanowires. The wavelength of the emitted light is determined in particular by the band structure of the quantum well sections and specifically their content of In. B. Guo et al. (see "Nanoletters", Volume 10, 2010, P. 3355) describe an LED made of (In,Ga)N/GaN nanowires on a silicon substrate, which emits various wavelengths in a broad spectral range (white light) by a variation of the semiconductor composition along the nanowires.

The production of LEDs with nanostructured semiconductors produces expectations of advantages compared to conventional GaN-based LEDs in terms of the growth conditions (possible use of silicon as substrate), the quantum yield of light emission and the adjustment of spectral properties (use of higher concentrations of In). However in practice until now only the few process parameters have been used to adjust specific emission properties which are also used in conventional LEDs, such as the composition of the semiconductor. In particular the adjustment of the emission of a specific spectral range, e.g. the adjustment of a white light emission, constitutes a great challenge for the control of procedural parameters in the production of the nanostructured semiconductors.

The specified problems not only have an effect on the production of LEDs, but also on other uses of nanostructured semiconductors, e.g. as electronic components, as electrothermal components or as electromechanical components (MEMS components).

OBJECTS OF THE INVENTION

The objective of the invention is to provide an improved method of producing a semiconductor device, which comprises a structured semiconductor, with which disadvantages of conventional methods can be avoided. The objective of the invention is in particular to provide a method of producing a semiconductor device with nanostructured semiconductor elements which is characterised by a simplified procedure. The method should also allow increased accuracy and/or reproducibility of the adjustment of optical, electrical, mechanical and/or thermal properties of the semiconductor elements. A further objective of the invention is to provide an improved semiconductor device, comprising a structured semiconductor, which avoids disadvantages of conventional semiconductor devices with structured semiconductors. The semiconductor device should in particular be suitable for a simplified production and/or an accurate and reproducible adjustment of physical or chemical properties.

These objectives are each solved by a method or a semiconductor device with the features of the invention.

DESCRIPTION OF THE INVENTION

According to general aspects of the invention, the above objectives are each solved by a method for producing a semiconductor device or by a semiconductor device, whereby the semiconductor device comprises a substrate and at least one semiconductor element, which has an elongated shape and which extends in a main direction which deviates from the extension of the surface of the substrate. The semiconductor element is characterised by a lateral thickness across the main direction which is less than the height (length) of the semiconductor element in the main direction. The elongated shape of the semiconductor element is formed such that the semiconductor element in at least one section plane has an aspect ratio (quotient of lateral thickness and length) of less than 1, preferably less than 0.1, and by special preference less than 0.05. The basic shapes of the semiconductor element are, for example, the shape of a column (or needle, wire or rod) or the shape of a wall (or disc). In the case of the column shape, the main direction is formed by the longitudinal direction of the column and in the case of the wall shape by a direction perpendicular to the wall thickness direction. Typically the main direction is oriented perpendicular to the surface of the substrate, but there may alternatively be an angle of inclination of less than 90°. The semiconductor element may have an essentially constant lateral thickness or alternatively a varying lateral thickness along its entire length. For example the column shape can be characterised by a diameter which gets smaller or larger from the substrate to the free end of the semiconductor element. Accordingly the semiconductor element can be characterised by the shape of a pyramid or frustum or a more complicated geometric shape.

Along the main direction, i.e. the direction in which the at least one semiconductor element extends from the surface of the substrate, the semiconductor element has an active region containing sections with various crystal types. At least two sections of a first crystal type are provided, between which a section of a second crystal type is arranged. In practical applications of the invention, a sequence of the sections of the first crystal type is preferred that are separated by sections of the second crystal type. The first and second crystal types are characterised by different lattice constants and different optical, electrical, mechanical and/or thermal properties, such as by different conduction properties and band gaps. Depending on the application of the invention, the sections of the different crystal types have different functions. For example in a LED the sections of the first crystal type are quantum well sections and the sections of the second crystal type are barrier sections.

The first and second crystal types have different lattice constants. The difference in lattice constants has the effect that lattice strain occurs in the sections of the first crystal type, which depends on the lattice constant in the second crystal type. Furthermore the at least one section of the second crystal type has a lattice strain which depends on the lattice constant in the adjacent sections of the first crystal type. For both crystal types the strain is laterally inhomogeneous.

According to the invention, the active region of the at least one semiconductor element is geometrically dimensioned such that the lattice strain in the at least two sections of the first crystal type depends not only on the lattice constant of the section of the second crystal type, but is also mutually dependent on the lattice constant of the respective other section of the first crystal type. The geometrical dimensioning of the active region means that the height (thickness in the main direction) of the section of the second crystal type and/or the lateral thickness (thickness across the main direction) of the semiconductor element, in particular of the active region, is selected such that the lattice strains of the sections of the first crystal type interfere or interact with each other.

The inventors have found that with the height of the section of the second crystal type, i.e. with the distance of the at least two sections of the first crystal type in the main direction, and with the lateral thickness of the active region, two new degrees of freedom are created which are not available with conventional methods, using which physical or chemical properties of the at least one semiconductor element can be adjusted. With conventional nanostructuring, e.g. in an LED, the quantum well sections are spaced so far apart that they cannot influence each other. By contrast, according to the invention a mutual dependency of the lattice strain of the sections of the first crystal type is specifically adjusted. In contrast with the findings described in US 2011/0127490 A1, the inventors have further found that, by the geometric dimensioning of the active region and thus with the lattice strain, the optical, electrical, mechanical and/or thermal properties of the semiconductor element can be more easily varied in contrast with the conventional approach of changing the composition. Especially when properties of the quantum wells are to be changed within the nanowire, the geometric dimensioning of the active region places fewer demands on the procedure than, for example, the conventional variation of composition of a semiconductor in a lengthwise direction of the nanowire. The changing of the vapour composition and temperature in the crystal growth process to vary the crystal composition can be substituted by varying the column geometry, which substantially simplifies the production method. Furthermore the reproducibility of the procedure can be improved.

The invention in particular is based on the following considerations of the inventors. Two crystals with different lattice constants coherently connected on one boundary surface are under mechanical strain. The strain influences important properties of the semiconductor, such as its electronic band structure, the charge carrier mobility, the thermal capacity or thermal conductivity. Stress occurs in conventional semiconductor devices with layered (unstructured) heterostructures from contiguous or interrupted thin layers, when the lattice mismatch determines the strain condition of the layer. However this could only be adjusted by the introduction of defects. In conventional semiconductor devices with nanostructured semiconductor elements, by contrast, the interaction of the physical or chemical properties of the sections of the first crystal type and thus the semiconductor elements by the lattice strain has previously not been considered. The invention is based on the idea of arranging crystallites with mismatch, i.e. different sections of different crystal types, such that strain relaxation takes place at the free surfaces of the semiconductor elements. It is an advantage here if the semiconductor elements have a high aspect ratio. The residual strain in the sections can in particular be adjusted by the specified geometric dimensions such as the quotients of the heights of the adjacent sections of the first and second crystal type and/or the quotient of the height of the active region and the lateral thickness of the active region.

According to a specially preferred embodiment of the invention, there is a selective adjustment of physical and/or chemical properties of the semiconductor element, in particular of optical, electrical, mechanical and/or thermal properties of the semiconductor element, by using predefined, material-related reference values to adjust the at least one height quotient of adjacent sections and/or of the height/lateral thickness quotient. During the production of the at least one semiconductor element, the process conditions are selected, e.g. with a "top-down" or with a "bottom-up" method using the specified reference values. The reference values are determined, e.g. by theoretical simulations depending on the specifically used materials, from existing tabular values or from simple experiments.

It is an advantage that different variants exist for the geometric dimensioning of the active region of the at least one semiconductor element. According to the first variant, the active region can be dimensioned such that all sections of the first crystal type along the main direction of the semiconductor element have the same lattice strain. As a result all sections of the first crystal type have the same optical, electrical, mechanical and/or thermal properties. On the other hand, the inventors have found that in an LED, for example, the lattice strain of the quantum well sections in the lengthwise direction of a column-shaped semiconductor element can vary if all barrier sections have the same height. Accordingly the spectral range of the emission would widen. By adjusting the same lattice strain in all sections in accordance with the first variant, a spectral widening of the light emission is thus minimised in the case of the LED application. According to a second variant by contrast, it is possible to arrange that at least two of the sections of the first crystal type along the main direction of the semiconductor element are specifically characterised by different lattice strains. As a result, e.g. in the case of the LED application, the lattice strains can be adjusted such that light with various wavelengths is emitted from all quantum well sections so that the at least one semiconductor element can be used as broadband light source.

According to a further advantageous embodiment of the invention, the lattice strain can be adjusted in at least one of the sections of the first crystal type, by embedding the section concerned on all sides in the material of the second crystal type. The section of the first crystal type not only has an interface with the section of the second crystal type in the main direction of the semiconductor element, but also in the thickness direction across the main direction. The advantage is that this provides an additional degree of freedom for the adjustment of the physical or chemical properties of the section concerned or the entire semiconductor element.

A semiconductor device according to the invention can be produced with one single semiconductor element, e.g. one single nanowire or nanowall, on the substrate. This variant can have advantages, e.g. in the use of the semiconductor element as electronic component in a circuit. According to a preferred embodiment of the invention, it is however provided that a plurality of semiconductor elements are arranged projecting from the substrate surface.

Depending on the desired application of the semiconductor device according to the invention, the method can be conducted so that all semiconductor elements have the same shapes and sizes or that the semiconductor elements are produced with different shapes and/or sizes. For example column and wall shapes can be combined on a common substrate.

The provision of a number of semiconductor elements on a common substrate firstly has the advantage that the effect of the adjustment of the electrical, optical, mechanical and/or thermal properties of the semiconductor elements according to the invention are added together. For example, LEDs can be created with a substantially increased brightness. Furthermore the provision of a number of semiconductor elements offers further variation possibilities for designing the semiconductor device. For example, the active regions of all semiconductor elements can be given the same dimensions, so that the physical and/or chemical properties of all semiconductor elements are identical. Alternatively the active regions of the semiconductor elements can be differently dimensioned, so that accordingly a variation of the physical and/or chemical properties is achieved within the semiconductor device.

It is an advantage that the invention can be realised with a number of semiconductors. Preferably the sections of the first and/or second crystal types are produced from a nitride-based semiconductor, especially a gallium nitride-based semiconductor, an arsenide-based semiconductor, in particular a gallium arsenide-based semiconductor, an antimonide-based semiconductor, in particular a gallium antimonide-based semiconductor, a phosphide-based semiconductor, in particular a gallium phosphide-based semiconductor, a silicon-based semiconductor and/or a germanium-based semiconductor.

According to specially preferred embodiments of the invention, the at least one semiconductor element is produced with the following geometric dimensions. Column-shaped semiconductor element: lateral thickness <1 µm, preferably <500 nm, particularly preferred <50 nm; length: >100 nm, preferably >500 nm, particularly preferred >1 µm; length of the active region: >50 nm, preferably >100 nm, particularly preferred >150 nm; number of sections of the first crystal type: at least 2, preferably at least 4, particularly preferred at least 6; height ($h_1$) of the sections of the first crystal type: <100 nm, preferably <10 nm, particularly preferred <5 nm; height ($h_2$) of the sections of the second crystal type: <100 nm, preferably <10 nm, particularly preferred <5 nm. Wall-shaped semiconductor element: dimensioning as for the column-shaped semiconductor element, with a freely selectable extension in the lengthwise direction of the plate.

In addition to the exemplary highlighted application of the semiconductor device according to the invention as light emitting component (LED), further preferred applications include the provision of an electronic component, e.g. in an integrated circuit, an optoelectronic component, e.g. a solar cell, an electromechanical component or a thermoelectric component.

BRIEF DESCRIPTION OF THE DRAWINGS

Further details and advantages of the invention are described below, making reference to the attached drawings as follows.

Preferred embodiments of the semiconductor device and the methods for their production according to the invention will be described below, in particular with reference to the geometric dimensioning of the active region of the semiconductor elements. Details of the method to produce the semiconductor elements through a structuring of thin layers ("top-down") or through a self-organised growth of the semiconductor elements ("bottom-up") will not be described here, as these are known from the state of the art. It is emphasised that the geometric dimensioning of the active region of the semiconductor elements according to the invention can be combined with conventional techniques to adjust optical, electrical, mechanical and/or thermal properties during the production of the semiconductor elements, e.g. by changing the composition.

The invention will in particular be described with respect to the adjustment of the lattice strain in the sections of the first crystal type. Depending on the particular application of the invention, the specific adjustment of the lattice strain in the sections of the second crystal type can be alternatively or additionally provided.

Although reference is made below by way of example to GaN-based semiconductors, it should be noted that the implementation of the invention is not restricted to these semiconductors only, but is also possible with other doped or undoped semiconductors.

The invention will be described below with reference by way of example to the production of an LED, in which the at least one nanostructured semiconductor element comprises a heterostructure made of quantum well sections and barrier sections. The sections of the first and second crystal type in the at least one semiconductor element are accordingly characterised in the following as quantum well sections and as barrier sections. Since the implementation of the invention is not restricted to the production of an LED device, the sections of the first and second crystal type have different functions in other applications to those of the quantum well sections and the barrier sections.

Figure 1:
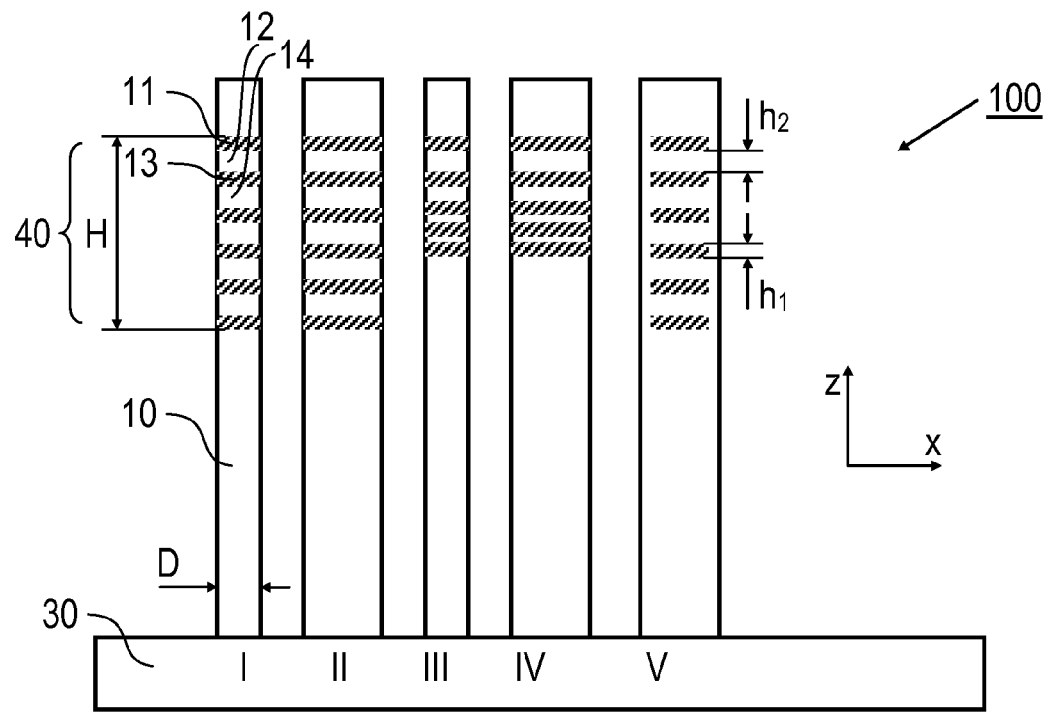
FIG. 1: schematic sectional views of different variants of column-shaped semiconductor elements according to the invention.

FIG. 1 illustrates in a schematic sectional view a semiconductor device 100 according to the invention with different variants of column-shaped semiconductor elements 10, which are arranged on a substrate 30. The semiconductor elements 10 have an elongated column shape with a main direction which in FIG. 1 runs as z-direction in the paper plane perpendicular to the surface of the substrate 30. The semiconductor elements 10 have e.g. a circular, elliptical or polygonal cross-section with a characteristic cross-section dimension (lateral thickness) D in x-direction in the range of e.g. 10 nm to 200 nm. The length of the semiconductor elements 10 in the z-direction has been selected for example in the range of 30 nm to 500 nm.

A sequence of quantum well sections 11, 13, . . . which is separated by barrier sections 12, 14, . . . , forms an active region 40, whose length in the z-direction has been selected for example in the range of 30 nm to 200 nm. The quantum well sections 11, 13, . . . have a height $h_1$, which has been selected in the range e.g. of 1 nm to 5 nm, whilst the barrier sections 12, 14, . . . have a height $h_2$ which for example has been selected in the range of 1 nm to 20 nm.

The quantum well sections 11, 13, . . . are for example produced from (In,Ga)N, whilst the barrier sections 12, 14, are produced from GaN. Accordingly the quantum well sections 11, 13, . . . have a narrower band gap than the barrier sections 12, 14, . . . , whereby the emission wavelength of the light emitted by the semiconductor elements 10 depends on the band gaps in the quantum well sections 11, 13, . . . . The substrate 30 consists, for example, of sapphire or silicon. The thickness of the substrate 30 is selected e.g. in the range of 250 μm to 1 mm.

According to the invention, the quotients of the heights $h_1$ and $h_2$ ($h_1$:$h_2$) and/or the quotients of height H and lateral thickness D (H:D) are selected such that the lattice strains in the quantum well sections 11, 13, . . . influence each other, as described below with reference to FIG. 4. For example the variants I and II differ due to the lateral thickness D. With increasing lateral thickness D, the influence of adjacent quantum well sections is reduced. Furthermore the variants III and IV demonstrate that the heights $h_2$ of the barrier sections can vary in the active region 40. The emission wavelengths of the quantum well sections differ accordingly. According to further variants, the heights $h_1$ of the quantum well sections can alternatively or additionally be varied in the z-direction. Finally variant V shows a structure in which the quantum well sections 11, 13, . . . are completely embedded in the material of the barrier sections 12, 14, . . . . The extension of the quantum well sections 11, 13, . . . in the x direction can for example be selected about 1 nm to 3 nm smaller than the lateral thickness D.

Figure 2:
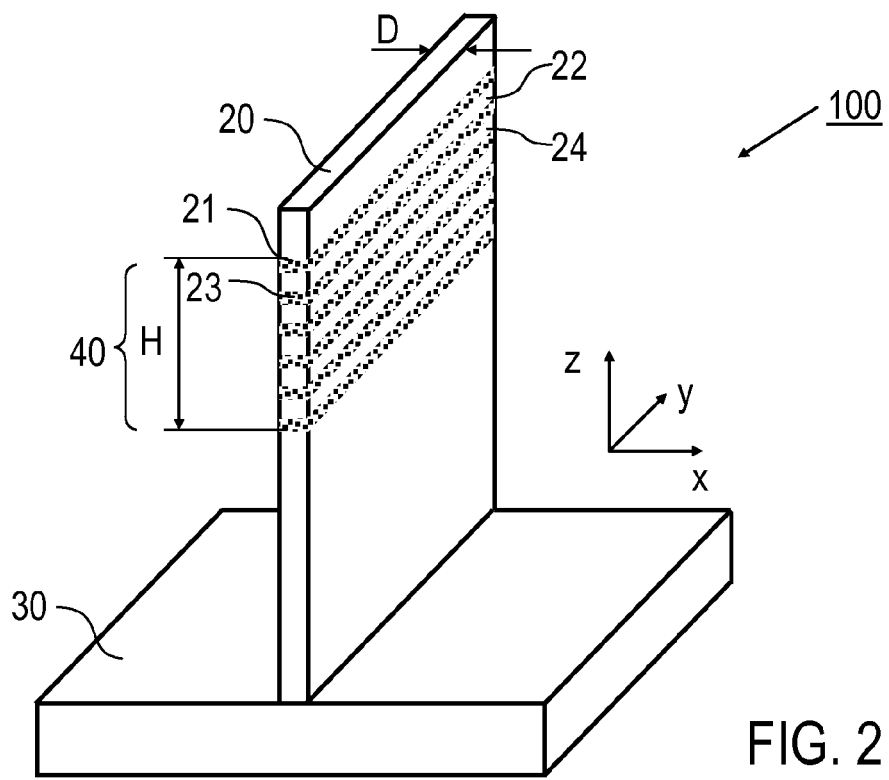
FIG. 2: a schematic perspective view of a variant of a wall-shaped semiconductor element according to the invention.

FIG. 2 schematically illustrates an embodiment of a semiconductor device 100 according to the invention with a wall-shaped semiconductor element 20 which is arranged on the substrate 30. The wall-shaped semiconductor element 20 has an essentially two-dimensional extension in the z- and y-directions, which has been selected in the range 200 nm to 2 μm. The lateral thickness D in the x-direction by contrast has been selected to be significantly lower in the range 20 nm to 200 nm. In the z-direction a sequence of quantum well sections 21, 23, . . . and barrier sections 22, 24, . . . create the active region 40 with a height H, which has been selected in the range 30 nm to 200 nm.

Figure 3:
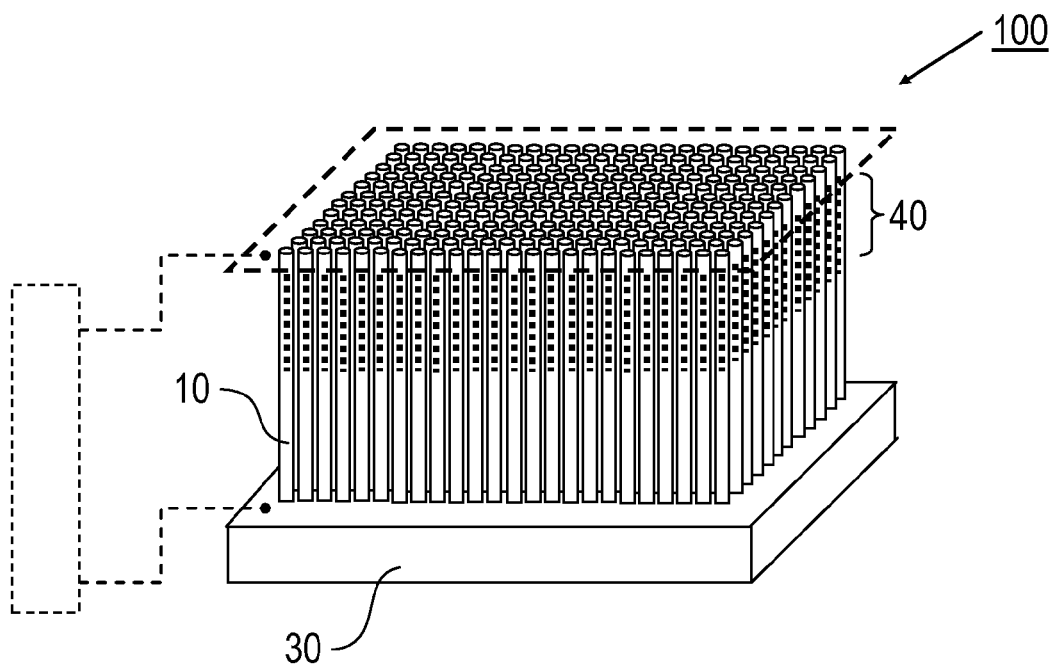
FIG. 3: a schematic perspective view of an embodiment of the semiconductor device with a plurality of column-shaped semiconductor elements.

FIG. 3 illustrates in a schematic perspective view of an embodiment of the semiconductor device 100 according to the invention, in which a plurality of column-shaped semiconductor elements 10 each with an active region 40 made of quantum well and barrier sections is arranged on the substrate 30. The semiconductor elements 10 cover an area on the substrate 30 equalling e.g. 100 μm² to 4 mm².

The at least one semiconductor element, in particular the column-shaped semiconductor elements 10 according to FIG. 3, can be produced according to the following methods. Firstly a self-organised crystal growth method can be realised, in which the growth in length is greater than the growth in width, as for example with the molecular beam epitaxy of GaN (0001) and (In,Ga)N(0001) under nitrogen-rich conditions. The lateral thickness D of the column-shaped semiconductor elements 10 can be adjusted by the selection and/or structuring of the substrate 30. The column shape is maintained during the growth of the quantum well sections and barrier sections. The height of the quantum well sections and the barrier sections is adjusted by the material supply during the molecular beam epitaxy. The complete embedding of the quantum well sections in the material of the barrier sections (variant E in FIG. 1) can be achieved by varying the process parameters. Alternatively, a production of the semiconductor elements 10 is possible by an etching of planar heterostructures. Firstly layers are produced from the quantum well and barrier section materials, in which column-shaped regions are then exposed by means of an etching method. A masking can be used for the etching, using which the cross-section shape of the column-shaped semiconductor elements 10 can be adjusted.

Only the semiconductor elements and the substrate are shown in FIGS. 1 and 2. In practice other components are provided depending on the specific application of the semiconductor device. For example, for contacting purposes with the LED application, contact electrodes are provided on the substrate or an upper electrode plate (shown as dotted lines in FIG. 3). The contact electrodes are e.g. connected to a control device and power supply. The semiconductor elements 10 can be formed according to Figure such that they fuse together at their top end, as described by A. Kikuchi et al. (see above), whereby a contacting of the semiconductor elements 10 is simplified.

Figure 4:
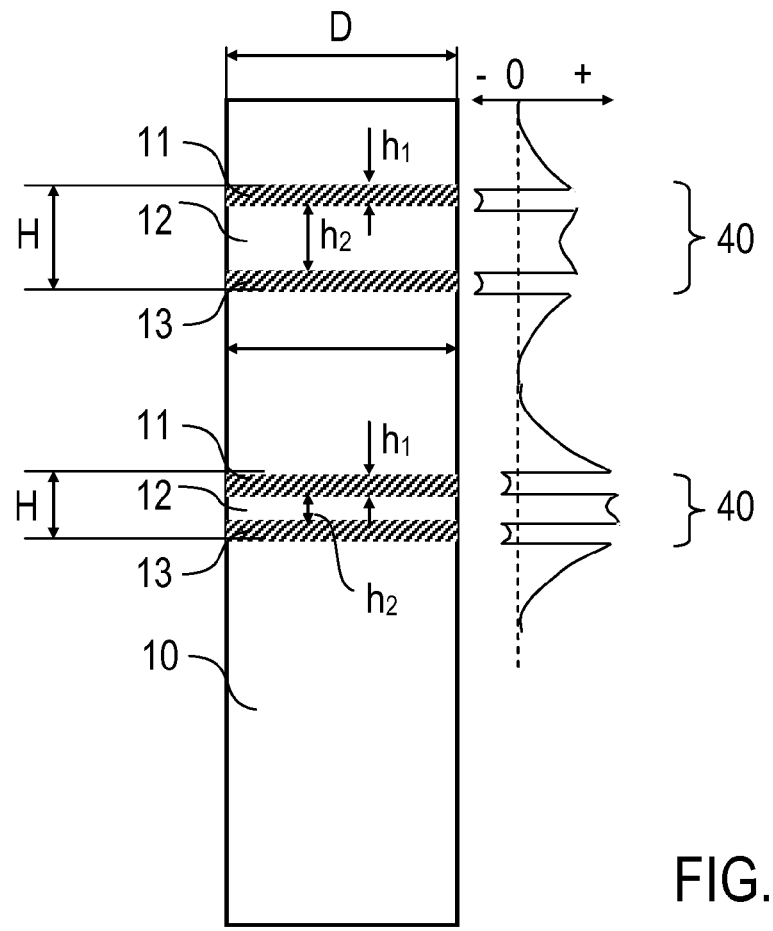
FIG. 4: a further schematic sectional view of a column-shaped semiconductor element.

FIG. 4 schematically illustrates the effect of the geometric dimensioning of the active region of one single column-shaped semiconductor element 10 provided according to the invention. A sequence of two sections 11, 13 of the first crystal type with height $h_1$ is shown in the top part of FIG. 4, which are separated by a barrier section 12 of the second crystal type with height $h_2$. Next to the semiconductor element 10, the mean lateral strain is shown schematically in the event that the lattice constant without strain of the first crystal type (11, 13) is greater than that from the material of the second crystal type. The lattice strain caused by the mismatch between the sections 11/12 and 12/13 leads to stress which in this example is compressive (+) in sections 11, 13 and tensile (+) in the adjacent section 12 (see continuous curve on the right-hand side of the semiconductor element 10). The reference state without strain is specified by the dotted straight line. With the relatively low ratio $h_1$:$h_2$ in the upper part, the strains in sections 11, 13 of the first crystal type do not influence each other or only do it slightly, i.e. the strain is principally determined by section 12 and the remaining semiconductor material. This situation is typically present in conventional semiconductor elements, but can likewise be specifically adjusted according to the invention, e.g. using specified, material-dependent reference values.

By contrast, if the ratio $h_1$:$h_2$ is selected larger according to the lower part of FIG. 4, the strain in one of the sections of the first crystal type (e.g. 11) impacts on the strain in the second of the sections of the first crystal type (e.g. 13) and vice versa, so that it is reduced overall. Accordingly the lattice strain in the sections 11, 13 of the first crystal type is adjusted using the geometric dimensioning of the heights $h_1$ and/or $h_2$. This effect can be influenced alternatively or additionally by the selection of the lateral thickness D of the semiconductor element 10.

The influence of the strain on the band structure of a semiconductor crystal illustrated in FIG. 4 is preferably used in light emitting components (LEDs). With a given composition of the crystal types, the energy of the photons created can be influenced for every single column by the strain. Therefore multi-coloured light can be generated with a low number of quantum well sections (crystal layers). For example three quantum well sections are provided.

In an alternative application of the invention in electronic components, use is made of the fact that the strain in semiconductors leads to increased mobility of charge carriers. This permits, for example, a reduction in size of the channel of field-effect transistors and thus a higher switching speed or packing density in integrated circuits.

According to a further application of the invention, the semiconductor element can be used in a thermally effective component. Since crystals have improved heat conductivity under compression, the heat conductivity can become anisotropic by the strain of individual crystal axes. A high heat conductivity permits the removal of lost heat from electronic components, whilst a low heat conductivity can boost the efficiency of thermoelectric systems.

Figure 5:
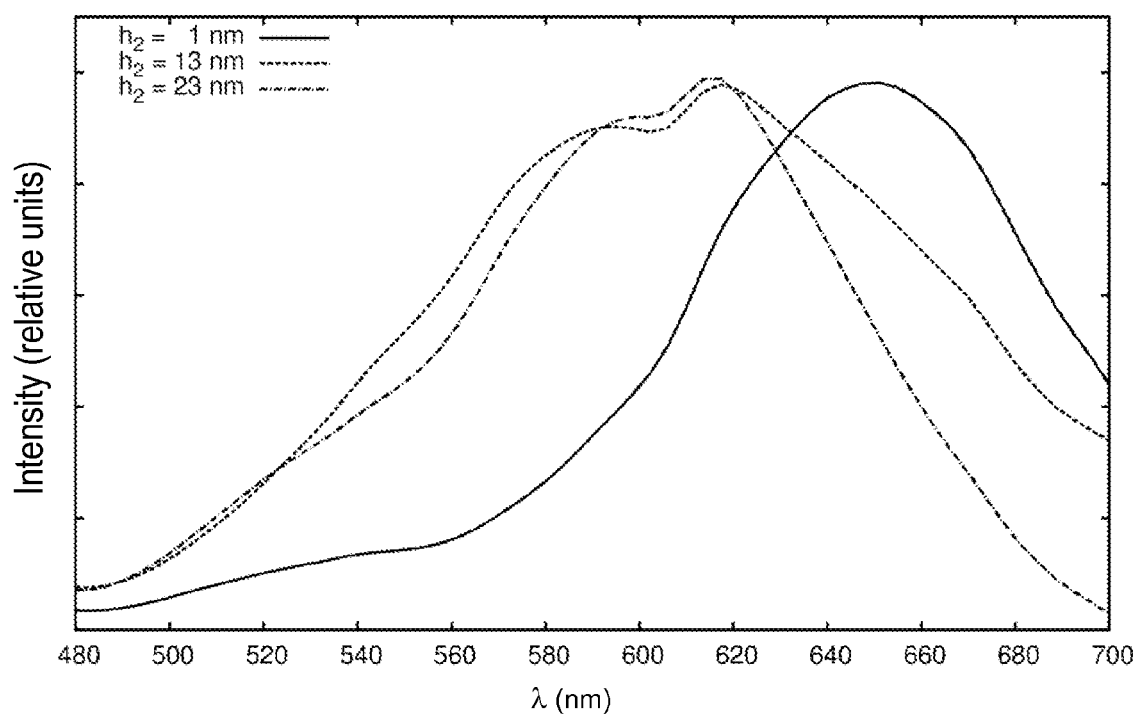
FIG. 5: room temperature photoluminescence spectra for the active zone of an LED according to the invention.

FIG. 5 illustrates an experimental result, which shows the shifting of the emission wavelength of an LED test structure according to the invention depending on the size $h_2$ of the barrier sections. With decreasing height $h_2$ of the barrier sections in the range from 23 nm to 1 nm, the wavelength of the light emission changes from 600 nm to 650 nm (intensity I, relative units). This effect can be exploited to specifically adjust a light emission with a desired spectral distribution depending on the geometrical dimensioning of the active region of the semiconductor elements.

The features of the invention disclosed in the above description, the drawings and the claims can be of importance individually or in combination for the realisation of the invention in its different embodiments.

The invention claimed is:

1. Method to produce a light emitting component, in which at least one column or wall-shaped semiconductor element is created on a substrate, which extends in a main direction, wherein, said method comprising the steps of:
   creating at least two quantum well sections of a first crystal type and between these a barrier section of a second crystal type arranged along the main direction in an active region of the light emitting component, each of the quantum well and barrier sections having defined heights ($h_1$, $h_2$), respectively, wherein the first and second crystal types have different lattice constants,
   forming each of the quantum well sections of the first crystal type with a lattice strain, which depends on the lattice constant in the barrier section of the second crystal type, and
   selectively adjusting at least one of optical and electrical properties of the light emitting component, wherein at least one of the height ($h_2$) of the barrier section of the second crystal type and a lateral thickness (D) of the active region perpendicular to the main direction is provided, such that the lattice strain in one of the quantum well sections of the first crystal type additionally depends on the lattice constant in the other quantum well section of the first crystal type.

2. Method in accordance with claim 1, wherein
at least one of at least one quotient of the heights ($h_1$, $h_2$) of adjacent quantum well and barrier sections of the first and second crystal types and a quotient of a height (H) and the lateral thickness (D) of the active region is provided such that the lattice strain in one of the quantum well sections of the first crystal type depends on the lattice constant in the other quantum well section of the first crystal type.

3. Method in accordance with claim 2, wherein
the step of selectively adjusting the at least one of the optical and electrical properties of the light emitting component is carried out by using predetermined, material-related reference values for adjusting at least one of the at least one quotient of the heights ($h_1$, $h_2$) of adjacent quantum well and barrier sections of the first and second crystal types and of the quotient of the height (H) and the lateral thickness (D) of the active region.

4. Method in accordance with claim 2, wherein
the at least one of the at least one quotient of the heights ($h_1$, $h_2$) of adjacent quantum well and barrier sections of the first and second crystal types and the quotient of the height (H) and the lateral thickness (D) of the active region is provided such that the at least one of the optical and electrical properties of all quantum well sections of the first crystal type are the same.

5. Method in accordance with claim 2, wherein
the at least one of the at least one quotient of the heights ($h_1$, $h_2$) of adjacent quantum well and barrier sections of the first and second crystal types and the quotient of the height (H) and the lateral thickness (D) of the active region is provided such that the at least one of the optical and electrical properties of at least two of the quantum well sections of the first crystal type are different.

6. Method in accordance with claim 1, wherein
the quantum well sections of the first crystal type in a thickness direction perpendicular to the main direction of the light emitting component are embedded in a material of the second crystal type.

7. Method in accordance with claim 1, further comprises the step of
creating a plurality of semiconductor elements on the substrate.

8. Method in accordance with claim 7, wherein
the at least one of the quotients of the heights ($h_1$, $h_2$) of adjacent quantum well and barrier sections of the first and second crystal types and the quotients of the heights (H) and the lateral thicknesses (D) of the active regions of light emitting components are provided such that the at least one of the optical and electrical properties of the sections of the first crystal type of all light emitting components are the same.

9. Method in accordance with claim 7, wherein
the at least one of the quotients of the heights ($h_1$, $h_2$) of adjacent quantum well and barrier sections of the first and second crystal types and the quotients of the heights (H) and the lateral thicknesses (D) of the active regions of the semiconductor elements are provided such that the semiconductor elements each have different optical and electrical properties of the quantum well sections of the first crystal type.

10. Method in accordance with claim 1, wherein the at least one semiconductor element is made of at least one semiconductor selected from the group consisting of:

nitride-based semiconductor;
arsenide-based semiconductor;
antimonide-based semiconductor;
phosphide-based semiconductor;
silicon-based semiconductor; and
germanium-based semiconductor.

11. Method in accordance with claim 10, wherein the at least one semiconductor element is made of at least one semiconductor selected from the group consisting of:
gallium nitride-based semiconductor;
gallium arsenide-based semiconductor;
gallium antimonide-based semiconductor; and
gallium phosphide-based semiconductor.

12. Light emitting component, comprising at least one column or wall-shaped semiconductor element on a substrate, wherein the semiconductor element extends in a main direction, wherein
at least two quantum well sections of a first crystal type extend along the main direction in an active region and between these a barrier section of a second crystal type each with a defined height are provided, wherein the first and second crystal types differ in terms of their lattice constants, and
each of the quantum well sections of the first crystal type has a lattice strain which depends on the lattice constant in the barrier section of the second crystal type, wherein
at least one of the height ($h_2$) of the barrier section of the second crystal type and a lateral thickness (D) of the active region perpendicular to the main direction is selected, such that the lattice strain in one of the quantum well sections of the first crystal type additionally depends on the lattice constants in the other quantum well section of the first crystal type.

13. Light emitting component according to claim 12, including at least one of the features
at least one of at least one quotient of the heights ($h_1$, $h_2$) of adjacent quantum well and barrier sections of the first and second crystal types and a quotient of the height (H) and the lateral thickness (D) of the active region is selected, such that the lattice strain in one of the quantum well sections of the first crystal type depends on the lattice constants in the other quantum well section of the first crystal type, and
at least one of at least one quotient of the heights ($h_1$, $h_2$) of adjacent quantum well and barrier sections of the first and second crystal types and a quotient of the height (H) of the active region and the lateral thickness (D) of the semiconductor element is selected to equal predetermined, material related reference values.

14. Light emitting component according to claim 12, wherein
the at least one of the at least one quotient of the heights ($h_1$, $h_2$) of adjacent quantum well and barrier sections of the first and second crystal types and the quotient of the height (H) and the lateral thickness (D) of the active region is selected such that the at least one of the optical and electrical properties of all quantum well sections of the first crystal type are the same.

15. Light emitting component according to claim 12, wherein
the at least one of the at least one quotient of the heights ($h_1$, $h_2$) of adjacent quantum well and barrier sections of the first and second crystal types and the quotient of the height (H) and lateral thickness (D) of the active region are selected such that the at least one of the optical and electrical properties of at least two of the quantum well sections of the first crystal type are different.

16. Light emitting component according to claim 12, comprising
a plurality of semiconductor elements, which are arranged on the substrate.

17. Light emitting component according to claim 16, wherein
the at least one of the quotients of the heights ($h_1$, $h_1$) of adjacent quantum well and barrier sections of the first and second crystal types and the quotients of the heights (H) and the lateral thicknesses (D) of the active regions of the semiconductor elements are selected such that the at least one of the optical and electrical properties of the quantum well sections of all semiconductor elements are the same.

18. Light emitting component according to claim 16, wherein
the at least one of the quotients of the heights ($h_1$, $h_2$) of adjacent quantum well and barrier sections of the first and second crystal types and the quotients of the heights (H) and the lateral thicknesses (D) of the active regions of the semiconductor elements are selected such that the semiconductor elements have different optical and electrical properties of at least two of the quantum well sections.

19. Light emitting component according to claim 12, wherein
the at least one semiconductor element comprises at least one semiconductor selected from the group consisting of:
nitride-based semiconductor;
arsenide-based semiconductor;
antimonide-based semiconductor;
phosphide-based semiconductor;
silicon-based semiconductor; and
germanium-based semiconductor.

20. Light emitting component according to claim 19, wherein the at least one semiconductor element comprises at least one semiconductor selected from the group consisting of:
gallium nitride-based semiconductor;
gallium arsenide-based semiconductor;
gallium antimonide-based semiconductor; and
gallium phosphide-based semiconductor.

21. Light emitting component according to claim 12, which
is a light emitting, electronic or opto-electronic component.

* * * * *